(12) United States Patent
Hwang et al.

(10) Patent No.: US 11,280,945 B2
(45) Date of Patent: Mar. 22, 2022

(54) POLARIZING PLATE AND OPTICAL DISPLAY COMPRISING THE SAME

(71) Applicant: Samsung SDI Co., Ltd., Yongin-si (KR)

(72) Inventors: Ji Hyun Hwang, Suwon-si (KR); Jin Woo Kim, Suwon-si (KR); Dong Yoon Shin, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 223 days.

(21) Appl. No.: 16/034,048

(22) Filed: Jul. 12, 2018

(65) Prior Publication Data
US 2019/0025486 A1 Jan. 24, 2019

(30) Foreign Application Priority Data

Jul. 18, 2017 (KR) .................. 10-2017-0091214
May 25, 2018 (KR) .................. 10-2018-0059956

(51) Int. Cl.
*G02B 5/30* (2006.01)
*C03C 17/42* (2006.01)
(Continued)

(52) U.S. Cl.
CPC ............ *G02B 5/3033* (2013.01); *C03C 17/34* (2013.01); *C03C 17/42* (2013.01); *G02B 6/0056* (2013.01);
(Continued)

(58) Field of Classification Search
CPC ...... G02B 5/30; G02B 5/3033; G02B 5/3083; G02B 5/282; G02B 6/0056; G02B 1/14;
(Continued)

(56) References Cited

U.S. PATENT DOCUMENTS 6,398,371 B1 * 6/2002 Matsunaga .............. G02B 1/11
359/599
2003/0214739 A1 11/2003 Funamoto et al.
(Continued)

FOREIGN PATENT DOCUMENTS

CN 1926467 A 3/2007
CN 101470214 A 7/2009
(Continued)

OTHER PUBLICATIONS

Taiwan Office action in corresponding Taiwan Application No. 107124527, Taiwan Office action dated Dec. 19, 2019 (3 pgs.).
(Continued)

*Primary Examiner* — Jie Lei
(74) *Attorney, Agent, or Firm* — Lewis Roca Rothgerber Christie LLP

(57) ABSTRACT

A polarizing plate and an optical display including the same are provided. A polarizing plate includes a display region and a non-display region surrounding the display region and includes: a polarizer; and a bonding layer, a first polarizer protective film, and a functional coating layer sequentially stacked on a surface of the polarizer. The bonding layer includes a printed layer therein to correspond to the non-display region. The polarizing plate has a haze of about 0.1% to about 5% as measured on the functional coating layer and a reflectance difference of about 2.4% or less between the display region and the non-display region, or the polarizing plate has a haze of about 20% to about 40% as measured on the functional coating layer and a reflectance difference of about 1.5% or less between the display region and the non-display region.

16 Claims, 4 Drawing Sheets

(51) Int. Cl.
  *H01L 51/52* (2006.01)
  *F21V 8/00* (2006.01)
  *C03C 17/34* (2006.01)

(52) U.S. Cl.
  CPC .... *H01L 51/5253* (2013.01); *C03C 2217/445* (2013.01); *C03C 2217/479* (2013.01); *C03C 2217/485* (2013.01); *H01L 51/5293* (2013.01)

(58) Field of Classification Search
  CPC ....... G02B 1/18; G02F 1/1333; G02F 1/1335; G02F 1/13363; G02F 1/133308; G02F 1/133528; C03C 17/42; C03C 17/34; C03C 2217/445; C03C 2217/479; C03C 2217/485; H01L 51/52; H01L 51/5253; H01L 51/5293; H01L 27/3232
  USPC ... 359/483.01, 489.2, 489.11, 601, 615, 507, 359/513, 589, 599, 884; 349/58, 110, 349/117, 118, 123
  See application file for complete search history.

(56) References Cited

U.S. PATENT DOCUMENTS

| | | | | |
|---|---|---|---|---|
| 2008/0026302 | A1* | 1/2008 | Shang | G03F 7/0757 430/7 |
| 2009/0190071 | A1* | 7/2009 | Kubota | G02F 1/133512 349/96 |
| 2011/0255041 | A1* | 10/2011 | Inoue | G02F 1/133723 349/123 |
| 2015/0036074 | A1* | 2/2015 | Park | G02F 1/133308 349/58 |
| 2016/0146980 | A1* | 5/2016 | Shin | G02B 5/3083 359/489.07 |

FOREIGN PATENT DOCUMENTS

| | | |
|---|---|---|
| CN | 101960334 A | 1/2011 |
| CN | 101978311 A | 2/2011 |
| CN | 102203640 A | 9/2011 |
| CN | 102667541 A | 9/2012 |
| CN | 107667313 A | 2/2018 |
| CN | 108287429 A | 7/2018 |
| CN | 109471289 A | 3/2019 |
| JP | 2012-150418 A | 8/2012 |
| JP | 2014-006447 A | 1/2014 |
| KR | 10-2011-0112084 A | 10/2011 |
| KR | 10-2013-0069340 A | 6/2013 |
| KR | 10-2015-0015243 A | 2/2015 |
| KR | 10-2016-0069617 A | 6/2016 |
| TW | 200424600 A | 11/2004 |
| TW | 200707028 A | 2/2007 |
| TW | 200712576 A | 4/2007 |
| TW | I304491 B | 12/2008 |

OTHER PUBLICATIONS

China Office action in corresponding China Application No. 201810781936.0, China Office action dated Jun. 29, 2020 (6 pgs.).

Korean Office Action in corresponding Korean Patent Application No. 10-2018-0059956, Korean Office Action dated Apr. 27, 2020 (5 pgs.).

Office Action in corresponding Korean Application No. 10-2018-0059956, Korean Office Action dated Nov. 30, 2020 (5 pgs.).

Chinese Office Action dated Sep. 24, 2021 for Application No. 202010268539.0, 8 pages.

\* cited by examiner

POLARIZING PLATE AND OPTICAL DISPLAY COMPRISING THE SAME

CROSS-REFERENCE TO RELATED APPLICATION

This application claims priority to and the benefit of Korean Patent Application No. 10-2017-0091214, filed on Jul. 18, 2017, and Korean Patent Application No. 10-2018-0059956, filed on May 25, 2018, in the Korean Intellectual Property Office, the entire disclosures of both which are incorporated herein by reference.

BACKGROUND

1. Field

Aspects of embodiments of the present invention relate to a polarizing plate and an optical display including the same.

2. Description of the Related Art

An optical display is composed of a display region and a non-display region. The display region is light transmissive and displays an image to be viewed through a screen. The non-display region is disposed along the periphery of the display region to surround the display region and is provided with a printed circuit board, a drive chip, and the like, to display an image. The non-display region is shielded by a light shielding layer or a printed layer so as not to be visible to a user of the optical display. In general, the printed layer may be formed by printing a composition for the printed layer on a window or by attaching a separate print tape to a cover window. However, these methods increase the thickness of the optical display.

On the other hand, the optical display includes a polarizing plate at the viewer side thereof in order to improve screen visibility. The polarizing plate is composed of a polarizer and a protective film for protection of the polarizer. Generally, a functional coating layer is further stacked on the protective film. However, the polarizing plate inevitably has haze in a limited range due to the functional coating layer. The optical display is divided into the display region and the non-display region due to the printed layer, such that glare or glinting occurs in the non-display region.

The background technique of the present invention is disclosed in Korean Patent Laid-open Publication No. 2015-0015243, and the like.

SUMMARY

According to an aspect of embodiments of the present invention, a polarizing plate has a compact structure, even with a printed layer, and can minimize or reduce glare or glinting between a display region and a non-display region.

According to another aspect of embodiments of the present invention, a polarizing plate can prevent or substantially prevent generation of cracks in a non-display region of an optical display, which has a curved edge in the non-display region thereof.

In accordance with one or more embodiments of the present invention, a polarizing plate, which includes a display region and a non-display region surrounding the display region, includes: a polarizer; a bonding layer, a first polarizer protective film, and a functional coating layer sequentially stacked on a surface of the polarizer, the bonding layer including a printed layer therein (e.g., embedded therein) to correspond to the non-display region, wherein the polarizing plate has a haze of about 0.1% to about 5% as measured on the functional coating layer, and a reflectance difference of about 2.4% or less between the display region and the non-display region, or wherein the polarizing plate has a haze of about 20% to about 40% as measured on the functional coating layer and a reflectance difference of about 1.5% or less between the display region and the non-display region.

In accordance with one or more embodiments of the present invention, an optical display includes the polarizing plate according to the present invention.

One or more embodiments of the present invention provide a polarizing plate that has a compact structure even with a printed layer and can minimize glare or glinting between a display region and a non-display region.

Further, one or more embodiments of the present invention provide a polarizing plate that can prevent or substantially prevent generation of cracks in a non-display region of an optical display, which has a curved edge in the non-display region thereof.

DETAILED DESCRIPTION

Figure 1:
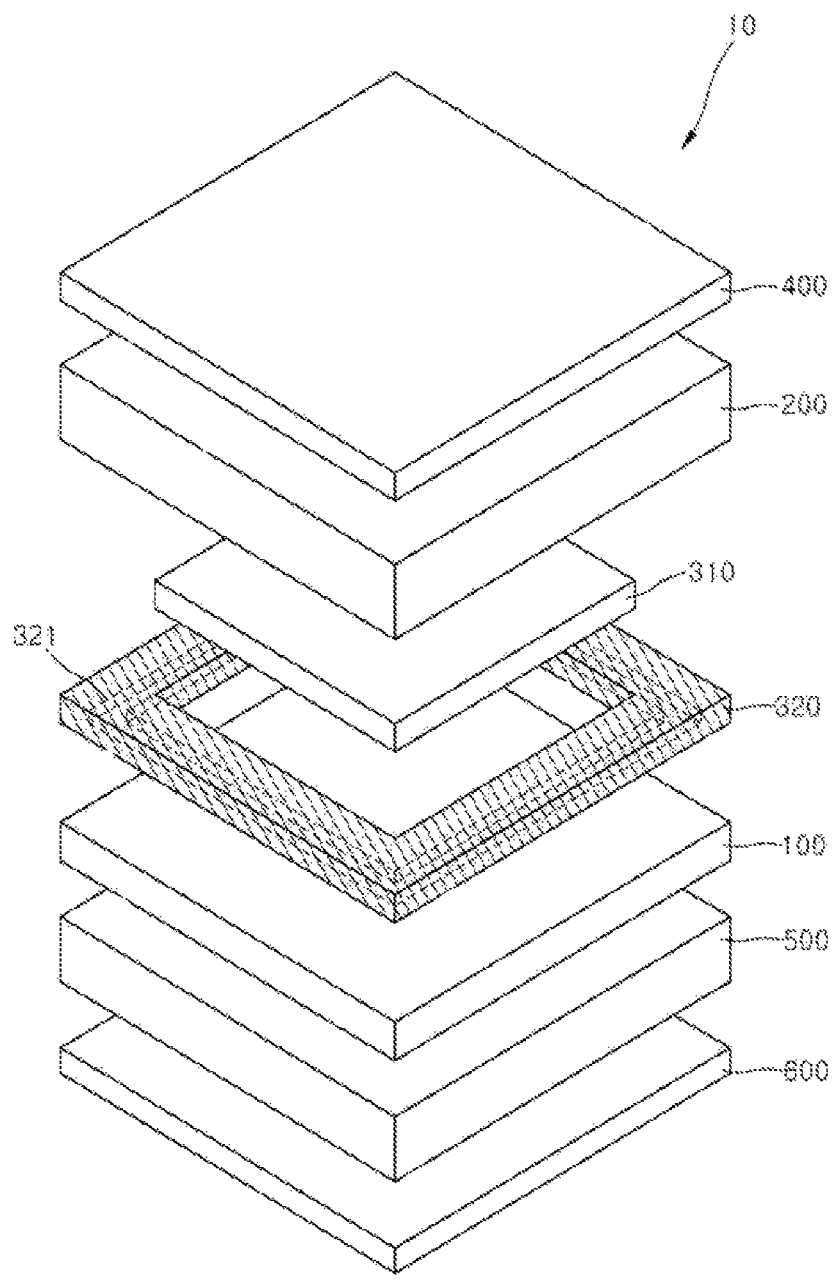
FIG. 1 is a perspective view of a polarizing plate according to an embodiment of the present invention.

Some embodiments of the present invention will be described in further detail with reference to the accompanying drawings to provide a thorough understanding of the invention to those skilled in the art. It should be understood that the present invention may be embodied in different ways and is not limited to the following embodiments. In the drawings, portions irrelevant to the description may be omitted for clarity. Like components are denoted by like reference numerals throughout the specification.

Herein, spatially relative terms, such as "upper" and "lower," are defined with reference to the accompanying drawings. Thus, it is to be understood that the term "upper surface" can be used interchangeably with the term "lower surface," and when an element, such as a layer or film, is referred to as being placed "on" another element, it may be directly placed on the other element, or one or more intervening elements may be present. On the other hand, when an element is referred to as being placed "directly on" another element, there are no intervening elements therebetween.

A polarizing plate according to one or more embodiments of the present invention is composed of a display region and a non-display region surrounding the display region. The polarizing plate includes a polarizer, a bonding layer formed on a surface of the polarizer, and a first polarizer protective film and a functional coating layer sequentially stacked on the bonding layer. The bonding layer may include a printed layer therein (e.g., embedded therein) to correspond to or constitute the non-display region. The printed layer may have a smaller thickness than the bonding layer and may be embedded in the bonding layer. In the bonding layer, the printed layer may be disposed adjacent to the first polarizer protective film and may be directly formed on the first polarizer protective film such that the bonding layer is present between the printed layer and the first polarizer protective film. In the polarizing plate according to the present invention, the printed layer is embedded in the bonding layer, thereby enabling a reduction of thickness in an optical display.

The polarizing plate according to embodiments of the present invention can prevent or substantially prevent a problem of glare or glinting between the display region and the non-display region due to the haze measured on the functional coating layer and a reflectance difference between the display region and the non-display region. In one embodiment, the polarizing plate according to the present invention may have a haze of 0.1% to 5%, as measured on the functional coating layer, and a reflectance difference of 2.4% or less between the display region and the non-display region. In another embodiment, the polarizing plate according to the present invention may have a haze of 20% to 40%, as measured on the functional coating layer, and a reflectance difference of 1.5% or less between the display region and the non-display region. Within this range, the polarizing plate can minimize or reduce glare or glinting upon operation of an optical display, thereby suppressing eye fatigue while improving screen visibility. The reflectance difference is mainly determined by at least one of detailed configurations including the composition of the printed layer, the location of the printed layer on the polarizing plate, the characteristics of the functional coating layer, the stack structure of the polarizing plate, and the like, which will be described in further detail below.

The polarizing plate according to one or more embodiments of the present invention includes a curve securing portion on the printed layer. As described below, the curve securing portion is an engraved pattern formed on a surface of the printed layer, and, in an embodiment, on a surface of the printed layer opposite a surface of the first polarizer protective film in the structure wherein the printed layer is disposed directly on the surface of the first polarizer protective film. Accordingly, the polarizing plate can prevent or substantially prevent generation of cracks in a non-display region of an optical display, which has a curved edge in the non-display region thereof. The curve securing portion will be described in further detail herein.

Herein, a polarizing plate according to an embodiment of the present invention will be described with reference to FIGS. 1 and 2. FIG. 1 is a perspective view of a polarizing plate according to an embodiment of the present invention; and FIG. 2 is a cross-sectional view of the polarizing plate of FIG. 1.

Figure 2:
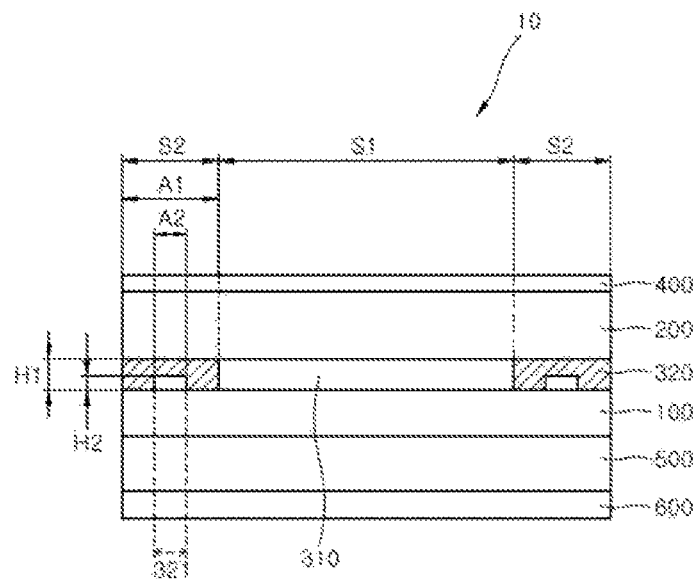
FIG. 2 is a cross-sectional view of the polarizing plate of FIG. 1.

Referring to FIGS. 1 and 2, a polarizing plate 10 according to an embodiment includes a polarizer 100, a first polarizer protective film 200 stacked on a surface of the polarizer 100 via a bonding layer 310, a functional coating layer 400 stacked on a surface of the first polarizer protective film 200, a second polarizer protective film 500 stacked on another surface of the polarizer 100, and an adhesive layer 600 stacked on a surface of the second polarizer protective film 500. The bonding layer 310 includes a printed layer 320 therein.

Although FIG. 1 and FIG. 2 show the polarizing plate including both the second polarizer protective film 500 and the adhesive layer 600, in an embodiment, at least one of the second polarizer protective film 500 and the adhesive layer 600 may be omitted.

The polarizing plate 10 may be disposed at a viewer side on a display panel of an optical display. Accordingly, the bonding layer 310, the first polarizer protective film 200, and the functional coating layer 400 are sequentially formed on a light exit surface of the polarizer 100. The polarizing plate 10 is composed of a display region S1 and a non-display region S2 surrounding a periphery of the display region S1 and corresponding to the printed layer 320. The display region S1 is a light transmissive region, and the non-display region S2 is a light opaque region.

In an embodiment, the polarizing plate 10 may have a haze of 0.1% to 5% as measured on the functional coating layer 400 and a reflectance difference of 2.4% or less between the display region S1 and the non-display region S2. Within this range, the polarizing plate can minimize or reduce glare and sparkling between the display region and the non-display region. Herein, the term "reflectance" means a value measured under the SCI (specular component included) conditions. The haze is mainly determined by the functional coating layer 400. In an embodiment, the polarizing plate has a haze of 0.1% to 3%.

The functional coating layer 400 provides an additional function to the polarizing plate and may provide at least one of anti-fingerprint, low reflection, anti-glare, anti-contamination, anti-reflection, diffusion, and refraction functions. Adjustment of the haze of the functional coating layer 400 can be realized by a typical method known to those skilled in the art.

In one embodiment, the functional coating layer may be formed of a light transmissive resin containing beads to provide an anti-reflection function.

The haze of the polarizing plate may be adjusted to 0.1% to 5% through adjustment of the particle diameter, content, and material of the beads in the functional coating layer. For example, the beads may be present in an amount of 0.5% by weight (wt %) to 25 wt % in the functional coating layer. Within this content range of beads, the functional coating layer can provide the anti-reflection function while securing a desired haze. In an embodiment, the beads are spherical particles formed of an organic material, an inorganic material, or an organic/inorganic material, and may include at least one of (meth)acrylic polymers, siloxane, styrene, calcium carbonate, barium sulfate, titanium dioxide, aluminum hydroxide, silica, glass, talc, mica, white carbon, magnesium oxide, and zinc oxide. In an embodiment, the beads include at least one of polystyrene (PS), poly(methyl methacrylate) (PMMA), and silica. In an embodiment, the beads may have an average particle diameter (D50) of 1 nm to 5 nm, and, in an embodiment, 2 nm to 3 nm. Within this range, the functional coating layer can provide the anti-reflection function while securing a desired haze.

In another embodiment, the functional coating layer 400 may have a roughness surface or may be formed by stacking a low refractivity layer and a high refractivity layer having different indices of refraction one above another. These methods are typically known in the art.

In an embodiment, the functional coating layer is an anti-reflection layer including beads and surface roughness.

In an embodiment, the functional coating layer 400 may have a thickness of 2 μm to 10 μm, and, in an embodiment, 2 μm to 8 μm, and, in an embodiment, 5 μm to 6 μm. Within this thickness range, the functional coating layer can be used in the polarizing plate.

In an embodiment, the entirety of the functional coating layer 400 and the first polarizer protective film 200 may have a haze of about 40% or less, for example, about 0.1% to 20%, about 0.1% to 10%, about 0.1% to 5%, or about 20% to about 40%. Within this range, the polarizing plate can realize a desired haze and a desired reflectance difference together with the printed layer.

The first polarizer protective film 200 having the functional coating layer 400 thereon may be formed by depositing the functional coating layer 400 over the first polarizer protective film 200, followed by curing, or may be obtained from commercially available products.

Although FIG. 1 shows a structure in which the functional coating layer is composed of a single layer, it should be understood that the functional coating layer may be composed of a plurality of layers in other embodiments of the present invention.

In an embodiment, a reflectance difference of about 2.4% or less between the display region S1 and the non-display region S2 can be realized by forming the printed layer on the other surface of the first polarizer protective film, which includes the functional coating layer formed on one surface thereof to realize a haze of about 0.1% to about 5%, such that the printed layer can be embedded in the bonding layer, which bonds the first polarizer protective film to the polarizer. In an embodiment, in the display region, the polarizing plate may have a reflectance of about 10% or less. In an embodiment, in the non-display region, the polarizing plate may have a reflectance of about 10% or less. Within this range, the polarizing plate can satisfy requirements for the reflectance difference according to the present invention, thereby minimizing or reducing glare and sparkling between the display region and the non-display region.

The printed layer 320 is formed on one surface of the bonding layer 310 to be embedded in the bonding layer 310. In an embodiment, the printed layer 320 directly adjoins the bonding layer 310.

In an embodiment, as shown in FIG. 1 and FIG. 2, the printed layer 320 is formed to surround a periphery of the bonding layer 310. The printed layer 320 is not formed as a separate layer from the bonding layer 310, thereby enabling a reduction of thickness in an optical display. The printed layer 320 may form or constitute a non-display region when the polarizing plate according to the present invention is mounted on the optical display.

In an embodiment, the printed layer 320 is formed on a light exit surface of the polarizer 100. Accordingly, a display function can be realized in a region of the polarizing plate in which the printed layer 320 is not formed. In another embodiment, the printed layer 320 may be formed on a light incident surface of the polarizer 100.

A thickness of the printed layer 320 may be less than or the same as a thickness of the bonding layer 310. FIG. 1 shows a structure in which the printed layer 320 has a same thickness as the bonding layer 310. In an embodiment, a thickness H1 of the printed layer 320 may be about 30% to about 100% of the thickness of the bonding layer 310, and, in an embodiment, about 30% to about 90%, and, in an embodiment, about 40% to about 80%. Within this thickness range, the printed layer 320 can be included in the bonding layer and can achieve thickness reduction of the polarizing plate while reducing the reflectance difference by realizing a desired haze on the functional coating layer. For example, the printed layer 320 may have the thickness H1 of about 0.1 μm to about 4 μm, and, in an embodiment, about 1.0 μm to about 4.0 μm. Within this thickness range, the printed layer can be included in the bonding layer, thereby securing light shielding while enabling thickness reduction of the polarizing plate.

The printed layer 320 is disposed between the polarizer 100 and the first polarizer protective film 200 and may have a partially open space. That is, the printed layer 320 may have a closed loop shape and may include an empty area therein. Accordingly, the interior of the printed layer 320 can be defined as an empty space inside the printed layer 320, which constitutes the closed loop. The printed layer 320 may be disposed along at least a portion or the entirety of an outer periphery of the polarizing plate 100 and the first polarizer protective film 200 in a horizontal cross-sectional view. It should be understood that the present invention is not limited thereto.

The printed layer 320 includes a composition for the printed layer described below to impart bonding strength to the first polarizer protective film 200 such that the polarizer 100 can be assembled to the first polarizer protective film 200 therethrough. Accordingly, even when the bonding layer 310 is not present between the polarizer 100 and the printed layer 320 and between the first polarizer protective film 200 and the printed layer 320, the polarizer 100 can be attached to the first polarizer protective film 200.

The printed layer 320 can shield or absorb light and, in an embodiment, may include a certain mark such as company logo, a dot pattern, and the like. Namely, a certain pattern may be formed on the printed layer 320 to provide an aesthetically pleasing appearance to an optical display.

In an embodiment, the composition for the printed layer 320 is a photocurable composition or a thermosetting composition and may include a pigment, a binder resin, and an initiator. With these components, the composition can form the printed layer 320 so as to have a further reduced thickness while securing the reflectance difference according to the present invention. The composition for the printed layer 320 may further include a solvent. The composition for the printed layer 320 may further include a reactive unsaturated compound.

In an embodiment, the pigment may include carbon black, a mixed pigment of silver-tin alloys, or a combination thereof. Examples of the carbon black may include carbon graphite, furnace black, acetylene black, and Ketjen black, without being limited thereto. The pigment may be provided in the form of a pigment dispersion, without being limited thereto.

In an embodiment, the binder resin may include an acrylic resin, a polyimide resin, a polyurethane resin, or a combination thereof. The acrylic resin may include any of a methacrylic acid/benzyl methacrylate copolymer, a methacrylic acid/benzyl methacrylate/styrene copolymer, a methacrylic acid/benzyl methacrylate/2-hydroxyethyl methacrylate copolymer, and a methacrylic acid/benzyl methacrylate/styrene/2-hydroxyethyl methacrylate copolymer, without being limited thereto. The polyurethane resin may include aliphatic polyurethane, without being limited thereto.

The reactive unsaturated compound has a lower weight average molecular weight than the binder resin and may include at least one of a photocurable unsaturated composition or a thermosetting unsaturated composition. The reactive unsaturated compound may include any of ethylene glycol diacrylate, ethylene glycol dimethacrylate, diethylene glycol diacrylate, triethylene glycol diacrylate, triethylene glycol dimethacrylate, 1,6-hexanediol diacrylate, 1,6-hexanediol dimethacrylate, pentaerythritol tri(meth)acrylate, pentaerythritol tetra(meth)acrylate, dipentaerythritol penta(meth)acrylate, dipentaerythritol hexa(meth)acrylate, bisphenol A epoxy (meth)acrylate, ethylene glycol monomethyl ether (meth)acrylate, trimethylolpropane tri(meth)acrylate, and tris(meth)acryloyloxyethyl phosphate, without being limited thereto.

The initiator may include at least one of a photopolymerization initiator and a thermal polymerization initiator.

The photopolymerization initiator may include any of acetophenone, benzophenone, thioxanthone, benzoin, triazine, and morpholine compounds, without being limited thereto.

The thermal polymerization initiator may include at least one selected from the group consisting of 1,3-bis(hydrazinocarbonoethyl-5-isopropylhydantoin) as a hydrazide compound; 1-cyanoethyl-2-phenylimidazole, N-[2-(2-methylimidazolyl)ethyl]urea, 2,4-diamino-6-[2'-methylimidazolyl-(1')]-ethyl-s-triazine, N,N'-bis(2-methyl-1-imidazolylethyl)urea, N,N'-(2-methyl-1-imidazolylethyl)-adipamide, 2-phenyl-4-methyl-5-hydroxymethylimidazole, and 2-phenyl-4,5-dihydroxymethylimidazole as imidazole compounds; tetrahydrophthalic anhydride and ethylene glycol-bis(anhydrotrimellitate) as acid anhydride compounds; a melamine compound; a guanidine compound; a dicyandiamide compound; and a modified aliphatic polyamine compound.

The solvent may include any of glycol ethers, such as ethylene glycol methylether, ethylene glycol ethylether, propylene glycol methylether, and the like; cellosolve acetates, such as methyl cellosolve acetate, ethyl cellosolve acetate, diethyl cellosolve acetate, and the like; carbitols, such as methylethyl carbitol, diethyl carbitol, diethylene glycol monomethylether, diethylene glycol monoethylether, diethylene glycol dimethylether, diethylene glycol methylethylether, diethylene glycol diethylether, and the like; and propylene glycol alkyl ether acetates, such as propylene glycol methyl ether acetate, propylene glycol propyl ether acetate, and the like, without being limited thereto.

In an embodiment, the composition for the printed layer may include about 1 wt % to about 50 wt % of the pigment (or pigment dispersion), about 0.5 wt % to about 20 wt % of the binder resin, about 0.1 wt % to about 10 wt % of the initiator, and the balance of the solvent. Within this range, the composition can secure formation of a printed layer having a thin thickness while providing a good light shielding effect.

In another embodiment, the composition for the printed layer may include about 1 to about 50 wt % of the pigment (or pigment dispersion), about 0.5 to about 20 wt % of the binder resin, about 1 to about 20 wt % of the reactive unsaturated compound, about 0.1 wt % to about 10 wt % of the initiator, and the balance of the solvent. Within this range, the composition can secure formation of a printed layer having a thin thickness while providing a good light shielding effect.

In an embodiment, the composition for the printed layer 320 may further include about 0.1 wt % to about 1 wt % of additives. The additives may include a silane coupling agent to assist in UV curing of the printed layer 320.

The printed layer 320 may be formed by photocuring or heat curing the composition for the printed layer, or a combination thereof. Photocuring or heat curing may be performed by a typical method known to those skilled in the art.

In an embodiment, a curve securing portion 321 is formed on at least one surface of the printed layer 320.

The curve securing portion 321 is formed on at least one surface of the printed layer 320 and is an engraved pattern having a cross-section (e.g., a predetermined cross-section). The height of the curve securing portion 321 is less than or the same as that of the printed layer 320 to form a step therebetween. The curve securing portion 321 allows the polarizing plate to be bent without generation of cracks when the polarizing plate is coupled to a curved edge portion of an optical display via the curve securing portion. Accordingly, when the curved edge portion of the optical display is surrounded by the polarizing plate, the curve securing portion relieves stress applied to the polarizing plate disposed on the curved edge portion to prevent or substantially prevent generation of cracks on the curved edge portion. In an embodiment, the curve securing portion 321 is formed on the polarizer 100 at a light exit side of the printed layer 320.

The curve securing portion 321 is formed within a surface of the printed layer 320. However, the location of the curve securing portion 321 on the printed layer 320 can be changed depending upon the curved edge portion of the optical display to be used.

In an embodiment, the curve securing portion 321 is an engraved pattern having a predetermined cross-section. The curve securing portion 321 may have the same or a larger cross-section than an edge of an optical display to be coupled to the curve securing portion. FIG. 1 shows the curve securing portion 321 which is an engraved pattern having a rectangular cross-section. However, the cross-sectional shape of the curve securing portion 321 is not limited thereto and may have an n-gonal shape consisting of n planes (n being an integer of 3 to 10). In another embodiment, the curve securing portion 321 may have a cross-sectional shape having at least one curved surface.

In an embodiment, a height H2 of the curve securing portion 321 may be in a range from 50% to about 100%, for example, 60% to 100%, of the height H1 of the printed layer 320. Within this range of height, the curve securing portion 321 can prevent or substantially prevent generation of cracks at a curved edge of an optical display by relieving stress to the polarizing plate due to the curved edge. FIGS. 1 and 2 show a structure in which the height H2 of the curve securing portion 321 is in a range from about 50% to less than about 100% of the height H1 of the printed layer 320. In an embodiment, the curve securing portion 321 may have the height H2 of about 0.1 μm to about 4 μm, for example, about 0.1 μm to about 2.5 μm, and, in an embodiment, about 0.5 μm to about 2.0 μm. Within this range of height, the curve securing portion 321 can prevent or substantially prevent generation of cracks at the curved edge.

In an embodiment, a width A2 of the curve securing portion 321 may be in a range from about 30% to about 100%, for example, about 30% to less than about 100%, and, in an embodiment, about 30% to about 80%, of a width A1 of the printed layer 320 having the curve securing portion 321 formed thereon. Within this range of width, the curve securing portion 321 can prevent or substantially prevent generation of cracks in the printed layer. FIGS. 1 and 2 show a structure in which the width A2 of the curve securing portion 321 ranges from about 0% to less than about 100% of the width A1 of the printed layer 320. In an embodiment, the curve securing portion 321 may have the width A2 of about 100 μm to about 3,000 μm, for example, about 500 μm to about 1,000 μm. Within this range of width, the curve securing portion 321 can prevent or substantially prevent generation of cracks in the printed layer.

The curve securing portion 321 may be formed by a typical method known to those skilled in the art. In one embodiment, the curve securing portion 321 may be formed by coating the composition for the printed layer 320 on one surface of the first polarizer protective film 200, applying an engraved pattern for the curve securing portion 321 to the composition, and curing the composition. In another embodiment, the curve securing portion 321 may be formed concurrently (e.g., simultaneously) with the printed layer 320 by coating the composition for the printed layer 320. In an embodiment, the curve securing portion 321 may be formed by repeatedly coating the composition for the printed layer 320 on one surface of the first polarizer protective film 200 such that a step can be finally formed thereon. Coating may be performed by gravure coating, without being limited thereto.

The bonding layer 310 is interposed between the polarizer 100 and the first polarizer protective film 200 to bond the polarizer 100 to the first polarizer protective film 200. In an embodiment, the bonding layer 310 is directly formed on each of the polarizer 100 and the first polarizer protective film 200.

The bonding layer 310 may be formed on at least one surface of each of the polarizer 100 and the first polarizer protective film 200. The polarizer 100 and the first polarizer protective film 200 may face each other and have substantially the same area in a horizontal cross-sectional view. That is, the polarizer 100 and the first polarizer protective film 200 may completely overlap each other in a horizontal cross-sectional view. The bonding layer 310 may be formed on at least part of the polarizer 100 and the first polarizer protective film 200. In an embodiment, the bonding layer 310 may be disposed in an island shape only at the center of the polarizer 100 and the first polarizer protective film 200 excluding the peripheries thereof.

The bonding layer 310 may be directly formed on the printed layer 320 such that the printed layer 320 can be stably disposed inside the polarizing plate 10.

The bonding layer 310 serves to bond or couple the polarizer 100 and the first polarizer protective film 200 to each other, and may include a water-based bonding agent or a UV-curable bonding agent. The water-based bonding agent may include at least one selected from the group consisting of polyvinyl alcohol resins and vinyl acetate resins, or may include a polyvinyl alcohol resin having a hydroxyl group, without being limited thereto. The UV-curable bonding agent may include any of acrylic, urethane-acrylic, and epoxy bonding agents, without being limited thereto. For example, the UV-curable bonding agent may include an epoxy resin, a (meth)acrylic resin, and an initiator.

In an embodiment, when the bonding layer 310 is formed of the water-based bonding agent, the bonding layer 310 may have a thickness of about 0.1 μm to about 4 μm, and when the bonding agent 310 is formed of the UV-curable bonding agent, the bonding layer 310 may have a thickness of about 2 μm to about 4 μm. When the thickness of the bonding layer falls within this range, a gap formed between the polarizer 100 and the first polarizer protective film 200 due to the printed layer 320 can be filled with the bonding layer, thereby improving durability of the polarizing plate. That is, the bonding layer 310 can minimize or reduce deviation between a region in which the printed layer 320 is present and a region in which the printed layer 320 is not present between the polarizer 100 and the first polarizer protective film 200.

The first polarizer protective film 200 may be formed on a surface of the bonding layer 310 to support the bonding layer 310 and the polarizer 100.

The first polarizer protective film 200 may be an optically transparent protective film. For example, the first polarizer protective film may be formed of at least one selected from among polyesters, such as polyethylene terephthalate (PET), polybutylene terephthalate, polyethylene naphthalate, and polybutylene naphthalate, acryl, cyclic olefin polymer (COP), cellulose esters, such as triacetylcellulose (TAC) resins, polyvinyl acetate, polyvinyl chloride (PVC), polynorbornene, polycarbonate (PC), polyamide, polyacetal, polyphenylene ether, polyphenylene sulfide, polysulfone, polyether sulfone, polyarylate, and polyimide.

In one embodiment, the first polarizer protective film 200 may include a polyester material. By way of example, the first polarizer protective film may be formed of an aromatic polyester material in order to secure crystallinity. For example, the first polarizer protective film 200 may be formed of polyethylene terephthalate (PET), polyethylene naphthalate (PEN), or a copolymer resin including the same, without being limited thereto. In an embodiment, the first polarizer protective film 200 may have a triple co-extrusion structure including polyethylene terephthalate, polyethylene naphthalate, or a copolymer resin including the same. In an embodiment, the polyester film may be formed by melt-extrusion of, for example, the aforementioned polyester resin into a film shape, followed by cooling the polyester resin on a casting drum.

In an embodiment, the first polarizer protective film 200 may have a thickness of about 30 μm to about 120 μm, and, in an embodiment, about 20 μm to about 80 μm. Within this range of thickness, the first polarizer protective film 200 can be used for an optical display.

The first polarizer protective film 200 may be an isotropic film or a retardation film. The isotropic film may include a film having an in-plane retardation Re of about 5 nm or less at a wavelength of 550 nm (Re=$(n_x-n_y) \times d$, where $n_x$ and $n_y$ are the indices of refraction at a wavelength of 550 nm in the slow axis and the fast axis of the protective film, respectively, and d is the thickness of the film). The retardation film may include a film having an in-plane retardation Re of greater than about 5 nm, for example, about 10 nm to about 15,000 nm, at a wavelength of 550 nm.

The second polarizer protective film 500 may have the same or different materials, thicknesses, and phase retardations from the first polarizer protective film 200.

The polarizer 100 may be formed on a lower surface of the bonding layer 310 to polarize light entering the polarizer 100. In an embodiment, the bonding layer 310 including the printed layer 320 directly adjoins the polarizer 100. With this structure, the polarizing plate can achieve a desired reflectance difference according to the present invention.

The polarizer 100 may include a polarizer. The polarizer may include a typical polarizer known to those skilled in the art. In an embodiment, the polarizer may include a polyvinyl alcohol-based polarizer obtained by uniaxially stretching a polyvinyl alcohol film, or a polyene-based polarizer obtained by dehydrating a polyvinyl alcohol film. In an embodiment, the polarizer 100 may have a thickness of about 5 μm to about 40 μm. Within this range, the polarizer can be used for an optical display.

The adhesive layer 600 serves to attach the polarizing plate to a display element and may be formed of any of typical adhesives known to those skilled in the art, for example, pressure sensitive adhesives (PSA) or optically clear adhesives (OCA). The adhesives may include a (meth) acrylic adhesive resin.

In an embodiment, the adhesive layer 600 may have a thickness of about 5 μm to about 100 μm. Within this range, the adhesive layer can be used for an optical display.

Next, a polarizing plate according to another embodiment will be described.

The polarizing plate according to another embodiment is substantially the same as the polarizing plate according to the above-described embodiment except that the haze measured on the functional coating layer is in a range from 20% to 40% and the reflectance difference between the display region and the non-display region is 1.5% or less.

The haze of about 20% to about 40% can be achieved by adjusting the particle diameter, size, and material of the beads in the functional coating layer or by adjusting the index of refraction of the resin forming the functional coating layer. The first polarizer protective film including a functional coating layer may be obtained from commercially available products. In an embodiment, the polarizing plate has a haze of about 25% to about 40%.

In an embodiment, the entirety of the functional coating layer and the first polarizer protective film may have a haze of about 20% to about 40%. Within this range, the polarizing plate can realize a desired haze and a desired reflectance difference together with the printed layer.

The reflectance difference can be achieved by adjusting the composition of the printed layer, the haze of the functional coating layer, or the location or shape of the printed layer. In some embodiments, a reflectance difference of about 1.5% or less between the display region S1 and the non-display region S2 can be realized by forming the functional coating layer capable of realizing a haze of about 20% to about 40% and further forming the printed layer in the bonding layer. In an embodiment, in the display region, the polarizing plate may have a reflectance of about 7% or less. In an embodiment, in the non-display region, the polarizing plate may have a reflectance of about 10% or less, for example, about 5% or less. Within this range, the polarizing plate can satisfy requirements for the reflectance difference, thereby minimizing or reducing glare and sparkling between the display region and the non-display region.

Figure 3:
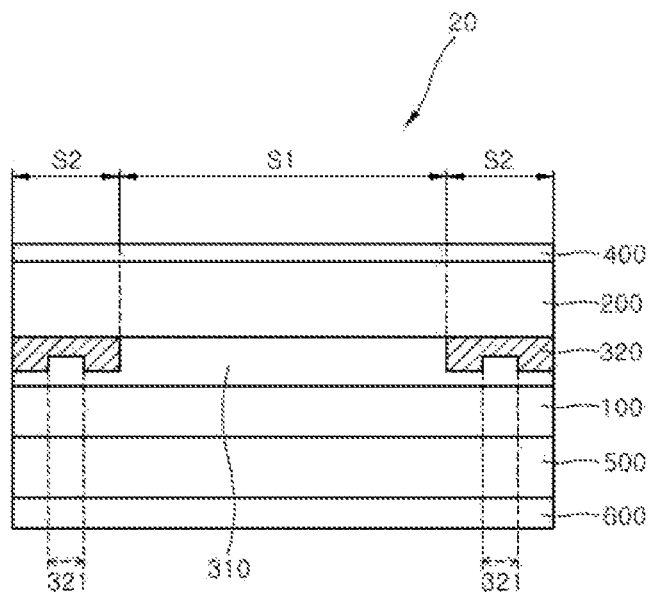
FIG. 3 is a cross-sectional view of a polarizing plate according to another embodiment of the present invention.

Next, a polarizing plate according to another embodiment of the present invention will be described with reference to FIG. 3. FIG. 3 is a cross-sectional view of a polarizing plate according to another embodiment of the present invention.

Referring to FIG. 3, a polarizing plate 20 according to another embodiment is substantially the same as the polarizing plate 10 according to the above-described embodiment except that the printed layer 320 of the polarizing plate 20 is directly formed on the first polarizer protective film 200, does not adjoin the polarizer 100, and has a smaller height than the bonding layer 310.

Figure 4:
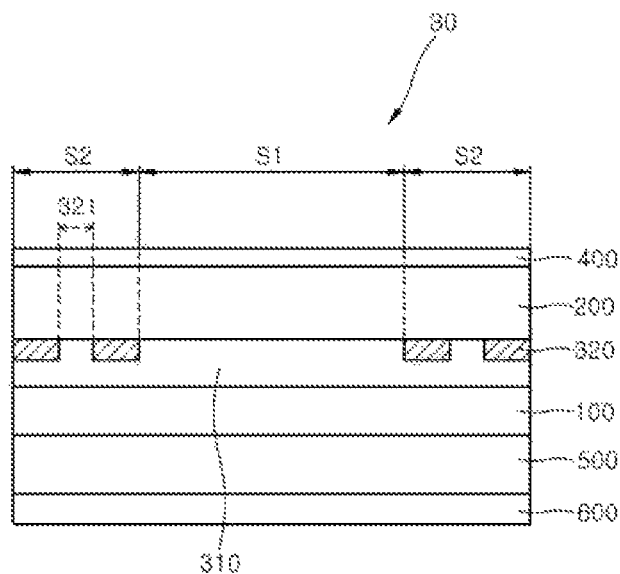
FIG. 4 is a cross-sectional view of a polarizing plate according to another embodiment of the present invention.

Next, a polarizing plate according to another embodiment of the present invention will be described with reference to FIG. 4. FIG. 4 is a cross-sectional view of a polarizing plate according to another embodiment of the present invention.

Referring to FIG. 4, a polarizing plate 30 according to another embodiment is substantially the same as the polarizing plate 10 according to the above-described embodiment except that the printed layer 320 of the polarizing plate 30 is directly formed on the first polarizer protective film 200, does not adjoin the polarizer 100 and has a smaller height than the thickness of the bonding layer 310, and the curve securing portion 321 has the same height as the printed layer 320.

Figure 5:
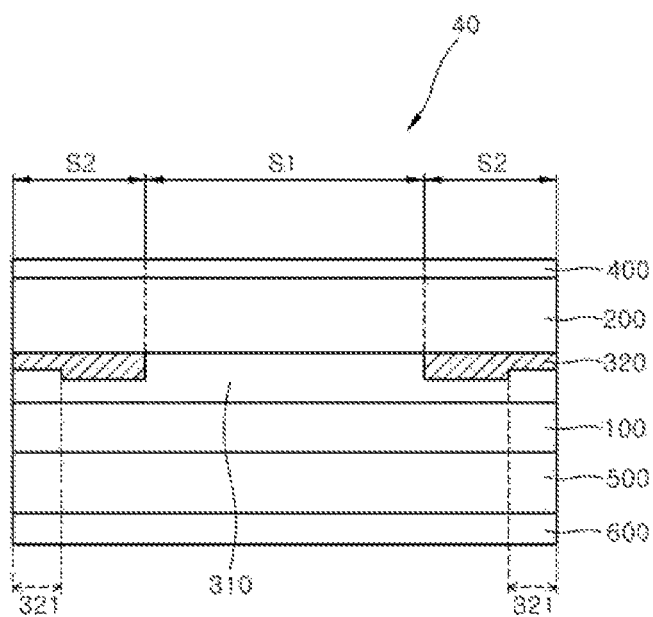
FIG. 5 is a cross-sectional view of a polarizing plate according to another embodiment of the present invention.

Next, a polarizing plate according to another embodiment of the present invention will be described with reference to FIG. 5. FIG. 5 is a cross-sectional view of a polarizing plate according to another embodiment of the present invention.

Referring to FIG. 5, a polarizing plate 40 according to another embodiment is substantially the same as the polarizing plate 10 according to the above-described embodiment except that the printed layer 320 of the polarizing plate 40 is directly formed on the first polarizer protective film 200, does not adjoin the polarizer 100 and has a smaller height than the thickness of the bonding layer 310, and the curve securing portion 321 is formed in an engraved pattern open at one side thereof towards an outer surface of the printed layer 320.

Figure 6:
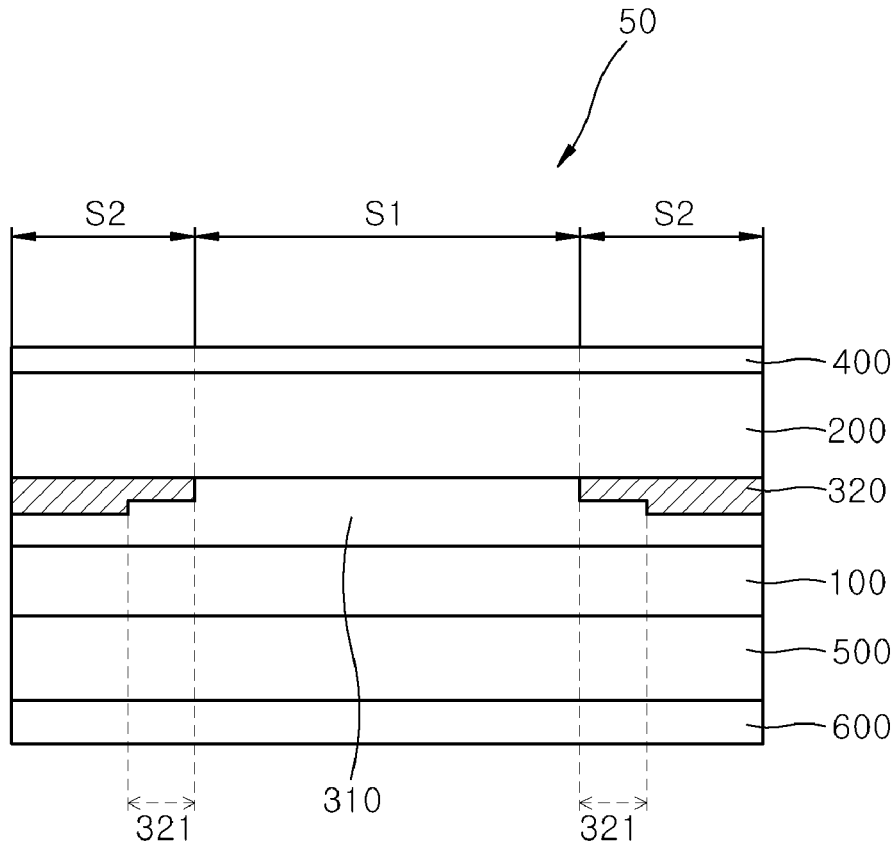
FIG. 6 is a cross-sectional view of a polarizing plate according to another embodiment of the present invention.

Next, a polarizing plate according to another embodiment of the present invention will be described with reference to FIG. 6. FIG. 6 is a cross-sectional view of a polarizing plate according to another embodiment of the present invention.

Referring to FIG. 6, a polarizing plate 50 according to another embodiment is substantially the same as the polarizing plate 10 according to the above-described embodiment except that the printed layer 320 of the polarizing plate 40 is directly formed on the first polarizer protective film 200, does not adjoin the polarizer 100 and has a smaller height than the thickness of the bonding layer 310, and the curve securing portion 321 is formed in an engraved pattern open at one side thereof towards an inner surface of the printed layer 320.

Although not shown separately, the present invention provides a method of manufacturing a polarizing plate, which includes: forming a printed layer along a periphery of a surface of a first polarizer protective film having a functional coating layer thereon; depositing a bonding layer on the surface of the first polarizer protective film on which the printed layer is formed; and coupling a polarizer to the first polarizer protective film such that the printed layer is interposed therebetween. A composition for the printed layer may be the same as described above.

In an embodiment, the step of forming the printed layer may be performed by coating the composition for the printed layer on the outer periphery of a surface of the first polarizer protective film using a micro gravure printer.

Thereafter, the composition for the printed layer may be cured by UV radiation to form the printed layer. Then, the step of depositing a bonding layer may be performed by depositing a bonding agent on a surface of the first polarizer protective film having the printed layer formed thereon. By deposition of the bonding agent, the bonding layer may be formed on at least part of a region in which the printed layer of the first polarizer protective film is not formed. That is, the bonding layer may be disposed in a space inside the printed layer by depositing the bonding agent. In an embodiment, the bonding layer may be formed so as to be placed only between the polarizer and the first polarizer protective film.

Thereafter, with the printed layer and the bonding layer interposed therein, the polarizer may be coupled to the first polarizer protective film, followed by curing the bonding agent and the printed layer through UV radiation. However, it should be understood that the present invention is not limited thereto. In another embodiment, before coupling the polarizer to the first polarizer protective film, pre-curing may be performed by irradiating the printed layer and the bonding layer with UV light. In another embodiment, after formation of the printed layer, UV curing, deposition of the bonding agent to form the bonding layer, coupling between the polarizer and the first polarizer protective film, and UV curing may be sequentially performed.

In an embodiment, the method may further include forming a separate protective layer on the other surface of the polarizer via the bonding layer interposed therebetween, or forming a primer layer on the other surface of the polarizer and forming an adhesive layer on the primer layer. These processes are well known to those skilled in the art and detailed descriptions thereof will be omitted.

According to embodiments of the present invention, an optical display includes the polarizing plate according to any of the embodiments described above. The optical display may include a liquid crystal display, an organic light emitting diode display, or the like, for example. In an embodiment, the polarizing plate according to the present invention may be disposed at a viewer side of the liquid crystal display.

Next, the present invention will be described in more detail with reference to some examples. However, it should be noted that these examples are provided for illustration and are not to be construed in any way as limiting the present invention.

Preparative Example 1

A black pigment was used as a pigment dispersion (A) containing 30 wt % of a pigment. Specifically, a pigment dispersion (A-1) comprising a silver-tin alloy (TMP-DC-1, Sumitomo Oosaka Cement Co., Ltd.) (solid content: 30%, weight ratio of silver to tin=7:3) and a pigment dispersion (A-2) comprising carbon black (CI-M-050, Sakata Co., Ltd.) were mixed in a ratio as listed in Table 1. An aliphatic polyurethane (B-1) (SUO-1000, Shina T&C Co., Ltd.) and an acrylic pressure-sensitive adhesive resin (B-2) (WA-9263, Wooin ChemTech Co., Ltd.) were used as a binder resin (B). In addition, a melamine curing agent (M60, thermosetting initiator, Wooin ChemTech Co., Ltd.) was used as an initiator (D), propylene glycol methylether acetate was used as a solvent (E), and 765 W (Tego Co., Ltd.) was used as a silane coupling agent (F).

A composition for a printed layer was prepared by adjusting the amounts of the pigment dispersion (A), the binder resin (B), the initiator (D), the solvent (E), and the silane coupling agent (F) as listed in Table 1 (unit: wt %).

TABLE 1

| | (A) | | (B) | | | | |
|---|---|---|---|---|---|---|---|
| | A-1 | A-2 | B-1 | B-2 | (D) | (E) | (F) |
| Preparative Example 1 | 25 | 20 | 8 | 3 | 3 | 40 | 1 |

Preparative Example 2

A black pigment was used as a pigment dispersion (A) containing 30 wt % of a pigment. Specifically, a pigment dispersion (A-1) comprising a silver-tin alloy (TMP-DC-1, Sumitomo Oosaka Cement Co., Ltd.) (solid content: 30%, weight ratio of silver to tin=7:3) and a pigment dispersion (A-2) comprising carbon black (CI-M-050, Sakata Co., Ltd.) were mixed in a ratio as listed in Table 2. An aliphatic polyurethane (SUO-1000, Shina T&C Co., Ltd.) was used as a binder resin (B), and dipentaerythritol hexaacrylate (Hannong Chemical Co. Ltd.) was used as a reactive unsaturated compound (C). In addition, a photopolymerization initiator IGR 369 was used as an initiator (D), propylene glycol methylether acetate was used as a solvent (E), and 765 W (Tego Co., Ltd.) was used as a silane coupling agent (F).

A composition for a printed layer was prepared by adjusting the amounts of the pigment dispersion (A), the binder resin (B), the reactive unsaturated compound (C), the initiator (D), the solvent (E), and the silane coupling agent (F) as listed in Table 2 (unit: wt %).

TABLE 2

| | (A) | | (B) | (C) | (D) | (E) | (F) |
|---|---|---|---|---|---|---|---|
| | A-1 | A-2 | | | | | |
| Preparative Example 2 | 25 | 20 | 8 | 3 | 3 | 40 | 1 |

Example 1

A printed pattern was formed along a periphery of a lower surface of a polyethylene terephthalate (PET) film (haze: 0.3%, DSG-17(Z) PET, DNP Co., Ltd.) having a functional coating layer (anti-reflection layer) formed on an upper surface thereof by gravure coating the composition prepared in Preparative Example 1 along the periphery of the lower surface thereof. The printed pattern was composed of a bilayer structure including a first printed layer and a second printed layer and was subjected to heat curing at 85° C. for 2 minutes to form a printed layer (thickness: 2.4 μm). Coating of the composition for the printed layer was performed plural times to form a step, thereby forming a curve securing portion, as shown in FIG. 3.

A polyvinyl alcohol film (thickness: 60 μm, polymerization degree: 2,400, saponification degree: 99.0%, VF-PS6000, Kuraray Co., Ltd., Japan) was subjected to swelling in an aqueous solution at 25° C., followed by dyeing and stretching in an iodine ion-containing dyeing bath at 30° C. Then, the dyed polyvinyl alcohol film was further stretched to 6 times an initial length thereof in a boric acid solution at 55° C. The obtained polyvinyl alcohol film was dried in a chamber at 50° C. for 3 minutes, thereby preparing a polarizer (thickness: 12 μm).

A bonding layer, the prepared polarizer, a bonding layer, a cycloolefin polymer film (ZB12-052125, Zeon Co., Ltd.) as a second polarizer protective film, and an adhesive layer (OS-207, Soken Co., Ltd.) were sequentially stacked on the surface of the PET film on which the printed layer was formed, thereby preparing a polarizing plate. The composition for the bonding layer contained an epoxy resin, a (meth)acrylate resin, a photopolymerization initiator, and a photocationic initiator.

Example 2

A film having a printed layer thereon was prepared by coating the composition of Preparative Example 1 along the periphery of the other surface (polyethylene terephthalate film surface) of a PET film (haze: 1%, HLAG6-PET, DNP Co., Ltd.) having a functional coating layer (anti-reflection layer) formed on one surface thereof in the same manner as in Example 1. A polarizing plate was prepared in the same manner as in Example 1 using the film.

Example 3

A film having a printed layer thereon was prepared by coating the composition of Preparative Example 1 along the periphery of the other surface (polyethylene terephthalate film surface) of a PET film (haze: 3%, ASDS20S-PET, DNP Co., Ltd.) having a functional coating layer on one surface thereof in the same manner as in Example 1. A polarizing plate was prepared in the same manner as in Example 1 using the film.

Example 4

A film having a printed layer thereon was prepared by coating the composition of Preparative Example 1 along the periphery of the other surface (polyethylene terephthalate film surface) of a PET film (haze: 25%, H-25 PET, DNP Co., Ltd.) having a functional coating layer on one surface thereof in the same manner as in Example 1. A polarizing plate was prepared in the same manner as in Example 1 using the film.

Example 5

A film having a printed layer thereon was prepared by coating the composition of Preparative Example 1 along the periphery of the other surface (polyethylene terephthalate film surface) of a PET film (haze: 40%, SHR4, DNP Co., Ltd.) having a functional coating layer on one surface thereof in the same manner as in Example 1. A polarizing plate was prepared in the same manner as in Example 1 using the film.

Example 6

A polarizing plate was prepared in the same manner as in Example 1 except that a printed layer was formed by coating the composition for the printed layer once without forming the curve securing portion.

Example 7

A printed layer (thickness: 3 μm) was formed on a polyethylene terephthalate (PET) film (haze: 3%, ASDS20S-PET, DNP Co., Ltd.) having a functional coating layer on one surface thereof by coating the composition of Preparative Example 2 along the periphery of the other surface (polyethylene terephthalate film surface) of the PET film, followed by removing the solvent at 85° C. for 1 minute and exposure at 650 mJ using a metal halide lamp. Here, coating of the composition for the printed layer was performed plural times to form a step, thereby forming a curve securing portion, as shown in FIG. 3. A polarizing plate was prepared in the same manner as in Example 1 using the prepared film.

Comparative Example 1

A printed layer having a curve securing portion formed thereon was formed on a PET film (haze: 3%, ASDS20S-PET, DNP Co., Ltd.) having a functional coating layer on one surface thereof by coating the composition of Preparative Example 1 along the periphery of the other surface (polyethylene terephthalate film surface) of the PET film in the same manner as in Example 1. A polarizer was prepared in the same manner as in Example 1. A polarizing plate was prepared by sequentially stacking an OCA resin (acrylic resin), a PET film (A4300, Toyobo Co., Ltd.), a bonding layer, the polarizer, a bonding layer, a cycloolefin polymer film, and an adhesive layer (OS-207, Soken Co., Ltd.) on the surface of the PET film on which the printed layer was formed.

Comparative Example 2

A printed layer having a curve securing portion formed thereon was formed on a PET film (haze: 25%, H-25 PET, DNP Co., Ltd.) having a functional coating layer on one surface thereof by coating the composition of Preparative Example 1 along the periphery of the other surface (polyethylene terephthalate film surface) of the PET film in the same manner as in Example 4. A polarizer was prepared in the same manner as in Example 4. A polarizing plate was prepared by sequentially stacking an OCA resin (acrylic resin), a PET film (A4300, Toyobo Co., Ltd.), a bonding layer, the polarizer, a bonding layer, a cycloolefin polymer film, and an adhesive layer (OS-207, Soken Co., Ltd.) on the surface of the PET film on which the printed layer was formed.

The polarizing plates prepared in the Examples and Comparative Examples were evaluated as to the properties listed in the following Table 3.

(1) Haze: Haze was measured using a haze meter (NDH 5000, Nippon Denshoku Co., Ltd.), in which each of the polarizing plates prepared in the Examples and Comparative Examples was placed such that the functional coating layer of the polarizing plate faced a light source.

(2) Reflectance 1: Reflectance 1 refers to SCI (specular component included) reflectance in a non-display region. With a reflectance meter (CM-2600D, Konica Minolta) placed in the non-display region of each of the polarizing plates prepared in the Examples and Comparative Examples, in which the printed layer was formed, Reflectance 1 was measured in an automatic mode three times under conditions of a measurement diameter (MAV) of φ8 mm and an illumination diameter (SAV) of φ3 mm. After measurement of Reflectance 1 five times, an average reflectance Y was then obtained.

(3) Reflectance 2: Reflectance 2 refers to SCI (specular component included) reflectance in a display region. Since the display region has an inherent transmittance of a polarizing plate, a black acryl plate (having an SCI reflectance of 3.92%) was placed at the adhesive layer side of each of the polarizing plates prepared in the Examples and Comparative Examples. With a reflectance meter (CM-2600D, Konica Minolta) placed in the display region, in which the printed layer was not formed, Reflectance 2 was measured in an automatic mode three times under conditions of a measurement diameter (MAV) of φ8 mm and an illumination diameter (SAV) of φ3 mm. After measurement of Reflectance 2 five times, an average reflectance Y was then obtained.

(4) Light shielding: Light shielding was measured with respect to the printed layer of each of the polarizing plates prepared in the Examples and Comparative Examples using a densitometer (TD-904: Gretag Macbeth Company) with a UV filter in accordance with JIS K7651:1988. In Table 3, a printed layer having an optical density of greater than 4.0 was rated as ○ and a printed layer having an optical density of 4.0 or less was rated as ×.

Figure 7:
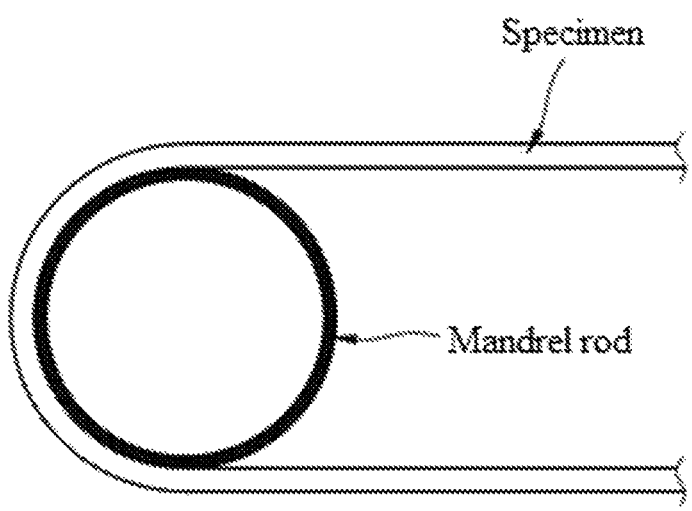
FIG. 7 is a conceptual diagram for illustrating evaluation of crack generation upon bending.

(5) Crack: Crack generation upon bending was evaluated by a mandrel evaluation method in accordance with JIS K5600. Each of the polarizing plates prepared in the Examples and Comparative Examples was cut into a rectangular specimen having a size of 150 mm×40 mm (MD× TD) with reference to the MD and TD of the polarizer. Referring to FIG. 7, the specimen was wound around a mandrel rod having a diameter of 10 mm by 180° such that the functional coating layer of the specimen contacted the mandrel rod, and was left for 5 seconds, followed by evaluation of crack generation in the printed layer. Generation of no cracks was evaluated as good and generation of cracks was evaluated as poor.

(6) Glare and sparkling: Degree of glare and sparkling was determined by comparing the display region with the non-display region with the naked eye under a three-wavelength lamp. No glare due to a small difference in visibility between the display region and the non-display region was rated as X, slight glare was rated a Δ, intermediate glare was rated as ○, and strong glare was rated as ⊚.

TABLE 3

|  | Printed layer | Presence of curve securing portion | Haze (%) | Reflectance 1 (%) | Reflectance 2 (%) | Reflectance difference (%) | Light shielding | Crack | Glare and sparkling in display region |
|---|---|---|---|---|---|---|---|---|---|
| Example 1 | Preparative Example 1 |  | 0.3 | 0.36 | 1.23 | 0.87 | ○ | Good | Δ |
| Example 2 | Preparative Example 1 | Present | 1 | 1.58 | 2.44 | 0.86 | ○ | Good | Δ |
| Example 3 | Preparative Example 1 | Present | 3 | 3.98 | 4.82 | 0.84 | ○ | Good | Δ |
| Example 4 | Preparative Example 1 | Present | 25 | 4.61 | 5.12 | 0.51 | ○ | Good | X |
| Example 5 | Preparative Example 1 | Present | 40 | 5.09 | 5.56 | 0.47 | ○ | Good | X |
| Example 6 | Preparative Example 1 | Absent | 0.3 | 4.08 | 4.98 | 0.90 | ○ | Poor | Δ |
| Example 7 | Preparative Example 2 | Present | 3 | 4.12 | 5.03 | 0.91 | ○ | Good | Δ |
| Comparative Example 1 | Preparative Example 1 | Present | 3 | 4.34 | 6.81 | 2.47 | ○ | Good | ○ |
| Comparative Example 2 | Preparative Example 1 | Present | 25 | 5.69 | 7.22 | 1.53 | ○ | Good | Δ |

As shown in Table 3, the polarizing plates according to the present invention could minimize or reduce glare or sparkling due to a small difference in visibility between the display region and the non-display region. In addition, the polarizing plate in which the curve securing portion was present in the printed layer could prevent or substantially prevent generation of cracks in the non-display region when applied to an optical display, in which the non-display region has a curved edge.

On the contrary, the polarizing plates of the Comparative Examples 1 and 2, which did not satisfy a desired reflectance difference in the haze range according to the present invention, exhibited a severe difference in visibility between the display region and the non-display region and exhibited more glare and sparkling at the same haze.

It should be understood that various modifications, changes, alterations, and equivalent embodiments can be made by those skilled in the art without departing from the spirit and scope of the invention.

What is claimed is:

1. A polarizing plate including a display region and a non-display region surrounding the display region, the polarizing plate comprising:
   a polarizer; and
   a bonding layer, a first polarizer protective film, and a functional coating layer sequentially stacked on a surface of the polarizer along a first direction, the bonding layer comprising a printed layer therein to correspond to the non-display region,
   wherein the polarizing plate has a haze of about 0.1° A to about 5% as measured with the functional coating layer facing a light source and a reflectance difference of about 2.4% or less between the display region and the non-display region, and the haze of the polarizing plate is mainly determined by the functional coating layer,
   wherein the printed layer is between the polarizer and the first polarizer protective film along the first direction, and
   wherein an entirety of the functional coating layer and the first polarizer protective film has a haze of about 0.1° A to about 5%, and the functional coating layer comprises an anti-reflection layer, and
   wherein the functional coating layer comprises at least one of surface roughness and beads.

2. The polarizing plate according to claim 1, wherein the printed layer adjoins a surface of the bonding layer while surrounding a periphery of the bonding layer.

3. The polarizing plate according to claim 1, wherein the printed layer has a thickness less than a thickness of the bonding layer.

4. The polarizing plate according to claim 1, wherein the printed layer directly adjoins the first polarizer protective film.

5. The polarizing plate according to claim 4, wherein the printed layer has a curve securing portion on a surface thereof opposite a surface of the printed layer adjoining the first polarizer protective film.

6. The polarizing plate according to claim 5, wherein the curve securing portion comprises an engraved pattern having a height less than or equal to a height of the printed layer.

7. The polarizing plate according to claim 5, wherein the curve securing portion is formed in an engraved pattern open at a side thereof toward an outer surface or an inner surface of the printed layer.

8. The polarizing plate according to claim 1, wherein the non-display region has a reflectance of about 10% or less.

9. The polarizing plate according to claim 1, wherein the printed layer is formed of a composition comprising a pigment dispersion, a binder resin, and an initiator.

10. The polarizing plate according to claim 9, wherein the pigment dispersion comprises carbon black, a mixed pigment of silver-tin alloys, or a combination thereof.

11. The polarizing plate according to claim 1, wherein the functional coating layer comprises beads and surface roughness.

12. The polarizing plate according to claim 1, further comprising a second polarizer protective film and an adhesive layer sequentially formed on another surface of the polarizer.

13. An optical display comprising the polarizing plate according to claim 1.

14. A polarizing plate including a display region and a non-display region surrounding the display region, the polarizing plate comprising:

a polarizer; and a bonding layer, a first polarizer protective film, and a functional coating layer sequentially stacked on a surface of the polarizer along a first direction, the bonding layer comprising a printed layer therein to correspond to the non-display region, wherein the polarizing plate has a haze of about 20% to about 40% as measured with the functional coating layer facing a light source and a reflectance difference of about 1.5% or less between the display region and the non-display region, wherein the printed layer is between the polarizer and the first polarizer protective film along the first direction, wherein the functional coating layer comprises at least one of surface roughness and beads.

15. The polarizing plate according to claim 14, wherein an entirety of the functional coating layer and the first polarizer protective film has a haze of about 40% or less.

16. The polarizing plate according to claim 14, wherein an entirety of the functional coating layer and the first polarizer protective film has a haze of about 20% to about 40%.

\* \* \* \* \*